(12) United States Patent
Lee

(10) Patent No.: US 7,028,247 B2
(45) Date of Patent: Apr. 11, 2006

(54) ERROR CORRECTION CODE CIRCUIT WITH REDUCED HARDWARE COMPLEXITY

(75) Inventor: Heng-Kuan Lee, Taipei Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 635 days.

(21) Appl. No.: 10/248,188

(22) Filed: Dec. 25, 2002

(65) Prior Publication Data

US 2004/0153722 A1   Aug. 5, 2004

(51) Int. Cl.
*H03M 13/15* (2006.01)

(52) U.S. Cl. .................................................... 714/784
(58) Field of Classification Search ................ 714/784
See application file for complete search history.

(56) References Cited

U.S. PATENT DOCUMENTS

| | | | | |
|---|---|---|---|---|
| 5,715,262 A * | 2/1998 | Gupta | ......................... | 714/784 |
| 5,787,100 A * | 7/1998 | Im | .............................. | 714/784 |
| 5,805,617 A * | 9/1998 | Im | .............................. | 714/785 |
| 6,173,429 B1 * | 1/2001 | Twitchell et al. | ............ | 714/746 |
| 6,349,318 B1 * | 2/2002 | Vanstone et al. | ............ | 708/492 |
| 6,353,909 B1 * | 3/2002 | Amrany et al. | .............. | 714/757 |
| 6,378,104 B1 * | 4/2002 | Okita | .......................... | 714/784 |
| 6,385,751 B1 * | 5/2002 | Wolf | .......................... | 714/784 |
| 6,701,336 B1 * | 3/2004 | Shen et al. | .................. | 708/492 |
| 6,725,416 B1 * | 4/2004 | Dadurian | ..................... | 714/785 |

* cited by examiner

*Primary Examiner*—Stephen M. Baker
(74) *Attorney, Agent, or Firm*—Winston Hsu

(57) ABSTRACT

An error correction code circuit with reduced hardware complexity is positioned inside a microprocessor. The microprocessor has a Galois field multiplier for performing a Galois field multiplication on data processed by the error correction code circuit. The error correction code circuit has a first register for storing an input data, a plurality of calculation units, a third register for storing an output data corresponding to the input data, and a controller for controlling operation of the error correction code circuit. Each calculation unit has a Galois field adder, and a second register electrically connected to the Galois field adder. The controller transmits data of each calculation unit to the same Galois field multiplier for a corresponding Galois field multiplication, and the result outputted by the Galois field multiplier is transmitted back to the error correction code circuit.

17 Claims, 9 Drawing Sheets

ERROR CORRECTION CODE CIRCUIT WITH REDUCED HARDWARE COMPLEXITY

BACKGROUND OF INVENTION

1. Field of the Invention

The present invention relates to an error correction code (ECC) circuit, and more particularly, to an ECC circuit with reduced hardware complexity.

2. Description of the Prior Art

An error correction code (ECC) has been widely used to prevent digital data from being affected by noise interference. For example, the error correction code such as a well-known Reed-Solomon code is applied to a broad spectrum of fields. Digital communication systems such as a mobile communication system, and a satellite communication system, as well as digital data storage devices such as the optical disk use the error correction code to confirm accuracy of the transmitted data and to correct error bits of the transmitted data. Please refer to FIG. 1, which is a prior art error correction system 10. The error correction system 10 includes an encoder 14 used to convert an input data 12 into a corresponding code word 16 according to a Reed-Solomon algorithm. The Reed-Solomon algorithm processes the input data 12 block by block. For example, RS(n,k) represents that the code word 16 has n symbols, and the input data 12 has k symbols wherein each symbol has m bits. The encoder 14 generates the ECC that has (n−k) symbols according to the input data 12. The calculated ECC is annexed to the input data 12 to form the code word 16. The ECC is calculated in a Galois field. For example, the ECC is generated according to GF($2^m$). A writing unit 18 is then used to record the code word 16 in a storage unit 20. A reading unit 22 is used to retrieve the code word 16 stored on the storage unit 20 and then transmits the retrieved code word 16 to a decoder 24 for converting the code word 16 into the original input data 12. The decoder 24 has a syndrome generator 26, a polynomial generator 28, an error locating circuit 30, an error value calculator 32, and an error correcting circuit 34. The syndrome generator 26 is used to check whether the code word 16 contains error bits, and then generates a syndrome corresponding to the code word 16. Based on the syndrome, the polynomial generator 28 applies a prior art Euclidean algorithm or a prior art Berlekamp-Massey algorithm to calculate an error value polynomial and an error location polynomial. According to the error location polynomial, the error locating circuit 30 applies a Chien search to calculate locations of the error bits. The error value calculator 32 then calculates error values corresponding to the error bits according to the locations of the error bits, the error value polynomial, and the error location polynomial. In the end, the error correcting circuit 34 uses the error values and related locations of the error bits to correct the error bits.

Please refer to FIG. 2, FIG. 3, and FIG. 4. FIG. 2 is a circuit diagram of the encoder 14 shown in FIG. 1. FIG. 3 is a circuit diagram of the syndrome generator 26 shown in FIG. 1. FIG. 4 is a circuit diagram of the error locating circuit 30 shown in FIG. 1. With regard to the encoder 14, the encoder 14 has a plurality of registers 36, a plurality of multipliers 38, and a plurality of adders 40. The prior art Reed-Solomon algorithm uses a generator polynomial G(x) to process the input data 12. Each multiplier 38 individually corresponds to one of the coefficients of the generator polynomial G(x), and is used to perform multiplication on the input data 12 with the corresponding coefficient. The adder 40 is used to perform addition on the multiplication result outputted from the multiplier 38 and the data stored in the register 36 preceding the adder 40, and stores addition result in the register 36 following the adder 40. It is noteworthy that the adder 40 performs an exclusive OR (XOR) logic operation in the Galois field. When the input data 12 has been inputted into the encoder 14 symbol by symbol, the register 36 stores the error correction code of the input data 12. Finally, the input data 12 and data stored in the register 36 are added by the adder 40 to generate the code word 16. With regard to the syndrome generator 26, the syndrome generator 26 also has a plurality of adders 40, a plurality of multipliers 38, and a plurality of registers 36. According to the prior art Reed-Solomon algorithm, the code word 16 with no error bit should be divided by the generator polynomial G(x) with the remainder equal to 0. If each symbol has 8 bits, the code word 16 corresponds to a polynomial R(x) having a degree of n, the input data 12 corresponds to a polynomial I(x), and the generator polynomial G(x) has a degree of k, the polynomial R(x) corresponds to the following equation.

$$R(x)=Q(x)*G(x)=I(x)\cdot X^{n-k}+r(x)=I(x)\cdot X^{n-k}+I(x)\cdot \text{mod}\cdot G(x)$$

The "mod" shown in the above equation stands for a modulo division. The degree of the generator polynomial G(x) is n, that is, the generator polynomial G(x) corresponds to n roots. The generator polynomial G(x) is represented by the following equation.

$$G(x)=\prod_{i=0}^{n-1}(x-\alpha^i),$$

where $\alpha^i$ corresponds to an element in the Galois field GF($2^8$).

Therefore, when each root $\alpha^i$ is applied to the above equation, the remainder is equal to 0. However, if the code word 16 contains error data E(x), the polynomial R(x) becomes the following equation.

$$R(x)=Q(x)*G(x)+E(x)$$

It is obvious that if each root $\alpha^i$ is applied to the above equation, the remainder corresponding to each root will not be equal to 0. The remainder corresponding to the root $\alpha^i$ becomes a syndrome corresponding to the root $\alpha^i$. Each symbol of the code word 16 is sequentially inputted into the syndrome generator 26. The adder 40 performs Galois field addition, and stores result in the register 36. Each multiplier 38 individually corresponds to one root $\alpha^i$ of the generator polynomial G(x), and is used to perform Galois field multiplication on the data stored in the register 36 according to the corresponding $\alpha^i$. Then, the Galois field addition is performed on the result of the multiplier 38 with the following symbol of the code word 16. The above operation is repeated until each symbol of the code word 16 has been processed. At this time, each register 36 stores one symbol of the code word 16. If each symbol is equal to 0, there is no error bit in the code word 16. After the syndrome generator 26 has finished calculating the syndromes, the polynomial generator 28 shown in FIG. 1 continues calculating an error location polynomial P(x).

$$P(x)=C_m*X^m+C_{m-1}*X^{m-1}+\ldots+1,2*m=k$$

The error locating circuit 30 is capable of calculating locations of the error bits according to the coefficients of the error location polynomial P(x) and the prior art Chien search algorithm. The error locating circuit 30 has a plurality of adders 40, a plurality of multipliers 38, and a plurality of registers 36. In the beginning, each register 36 individually stores a coefficient of the error location polynomial P(x) as an initial value, and each multiplier 38 individually corresponds to $\alpha^m, \alpha^{m-1}, \ldots, \alpha^1$. Each multiplier 38 performs a Galois field multiplication on data stored in a corresponding register 36, and the multiplication result updates the corresponding register 36. Finally, the data stored in each register 36 are added together by adders 40 to determine whether the addition result is a predetermined value (1 or 0 for example). Therefore, the error locating circuit 30 can find out which symbol in the code word 16 is erroneous. The above-mentioned encoder 14, syndrome generator 26, and the error locating circuit 30 have been widely used in handling error correction codes. The detailed operating principles and algorithms are not related to the primary objective of the present invention, and the lengthy description for the well-known operating principles and algorithms is skipped for simplicity.

Because the ECC is calculated in the Galois field, either the encoder 14 or the decoder 24 has to apply the Galois field addition and Galois field multiplication to an input data to generate the corresponding ECC. Therefore, the multipliers 38 and the adders 40 shown in FIG. 3 and FIG. 4 are necessary for both of the encoder 14 and the decoder 24. A prior art ECC circuit has been disclosed to use the same multipliers and adders in different circuits to perform different functions. For example, the U.S. Pat. No. 4,584,686 "REED-SOLOMON ERROR CORRECTION APPARATUS" has disclosed an ECC circuit that integrates the encoder 14 and the syndrome generator 26 shown in FIG. 1. The encoder 14 and the syndrome generator 26 share the same registers, multipliers, and adders to economize the use of actual hardware and to lower production cost. However, the prior art ECC circuit still requires a plurality of multipliers. The hardware of the multiplier is more complex than that of the adder, and the power consumption of the multiplier is greater than that of the adder. Therefore, the prior art ECC has a large size and consumes a great amount of power owing to the multipliers. In addition, the production cost is increased because of the multipliers.

SUMMARY OF INVENTION

It is therefore a primary objective of the claimed invention to provide an ECC circuit with reduced hardware complexity to solve the above-mentioned problems.

Briefly summarized, the preferred embodiment of the claimed invention discloses a processing circuit of a microprocessor for processing an input data to generate an output data. The microprocessor comprises a Galois field multiplier electrically connected to the processing circuit for performing a Galois field multiplication upon a plurality of processing data being processed by the processing circuit. The processing circuit comprises a first register for storing the input data, a plurality of processing units each being cascaded in series, and a controller for controlling operation of the processing circuit. A starting processing unit of the processing units is electrically connected to the first register. Each processing unit comprises an input port, an output port, a Galois field adder electrically connected between the input port and the output port, and a second register electrically connected to the Galois field adder. The controller controls each processing unit to transmit processing data requiring Galois field multiplication to the Galois field multiplier, and the processing data outputted from the Galois field multiplier are transmitted back to each corresponding processing unit.

It is an advantage of the claimed invention that each processing unit of the claimed processing circuit has no multiplier. When processing data requiring the Galois field multiplication, the processing data is transmitted from the processing unit to an external Galois field multiplier. The processing circuit, therefore, has low power consumption and a small size without any multipliers located inside each processing unit. In addition, each processing unit of the claimed processing circuit has a plurality of switches. The claimed processing circuit can control the on/off statuses of the switches to form different circuits for different purposes. Therefore, the different circuits share the same circuit elements to achieve the objective of sharing hardware resource. The calculations related to the Reed-Solomon code can be fulfilled through a small amount of circuit elements so that the processing circuit needs only a small space to locate the circuit elements. In addition, the claimed circuit uses buffers to form a pipeline structure to handle different input data simultaneously. Not only is the processing efficiency improved, but also the critical path is shortened.

These and other objectives of the claimed invention will no doubt become obvious to those of ordinary skill in the art after reading the following detailed description of the preferred embodiment that is illustrated in the various figures and drawings.

DETAILED DESCRIPTION

Figure 5:
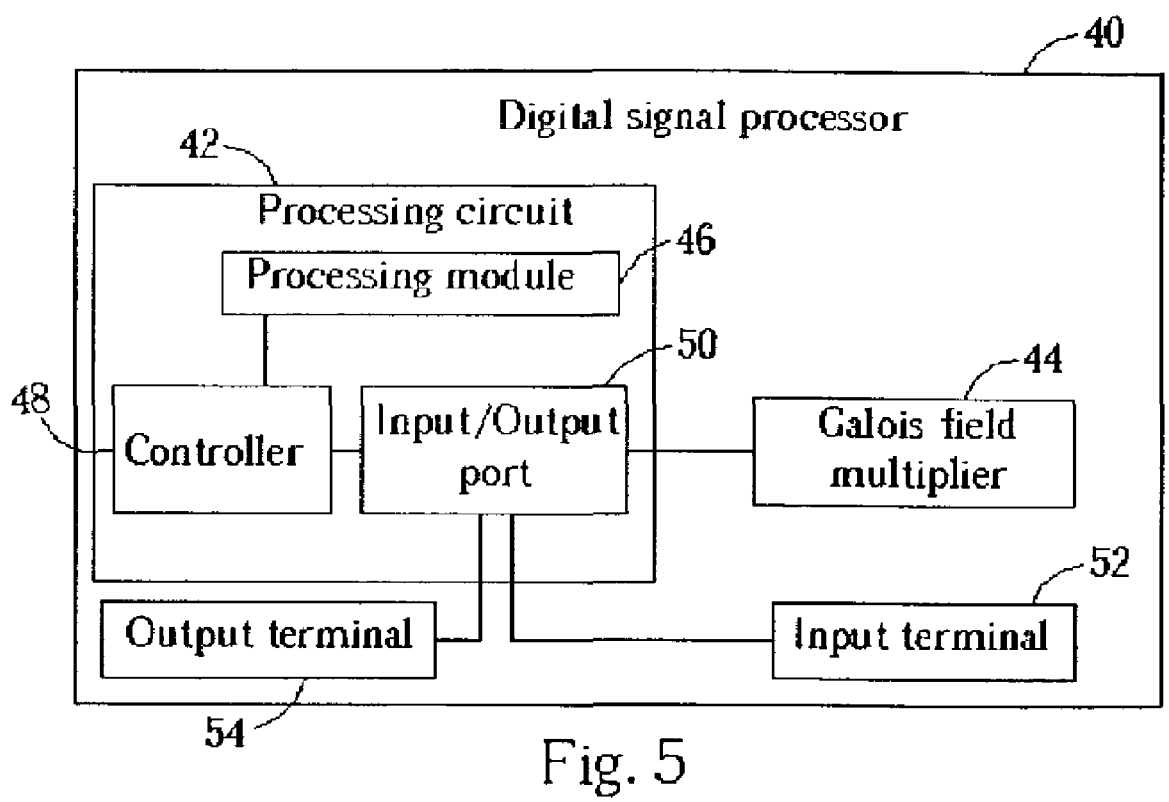
FIG. 5 is a block diagram of a digital signal processor according to the present invention.

Please refer to FIG. 5, which is a block diagram of a digital signal processor 40 according to the present invention. The digital signal processor 40 is used to perform an encoding operation and a decoding operation for the Reed-Solomon codes. The digital signal processor 40 has a processing circuit 42 and a Galois field multiplier 44. The processing circuit 42 has a processing module 46, a controller 48, and an input/output port 50. The input/output port 50 receives an input data from an input terminal 52 of the digital signal processor 40. The controller 48 transmits the input data to the processing module 46. The processing module 46 is used to perform the Galois field addition on the input data. However, when the Galois field multiplication is required on the input data, the controller 48 transmits the input data to a Galois field multiplier 44 via the input/output port 50. After the Galois field multiplier 44 finishes processing the input data, the input data will be transmitted back to the processing module 46 for following operations. In the preferred embodiment, the processing module 46 is used to handle the Galois field addition, the Galois field multiplier 44 is used to handle the Galois field multiplication, and the controller 48 manages data transferred between the processing module 46 and the Galois field multiplier 44 until the input data has been processed by required addition and multiplication. In the end, the calculation result is outputted to an output terminal 54 of the digital signal processor 40 via the input/output port 50. Please note that the Galois field addition is equivalent to an XOR logic operation.

Figure 1:
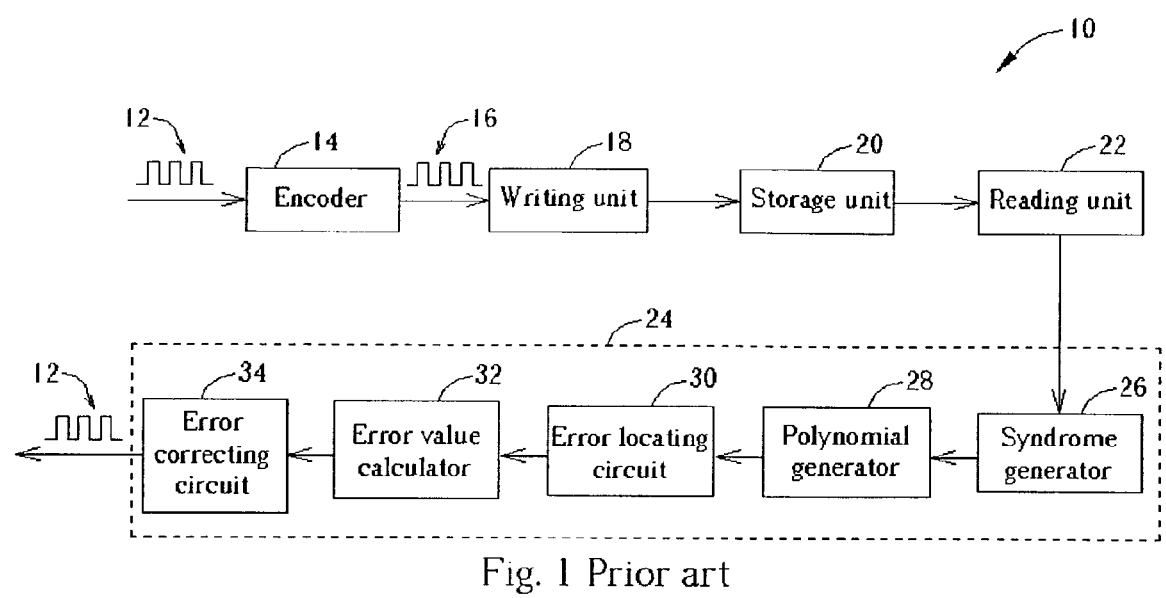
FIG. 1 is a prior art error correction system.
Figure 2:
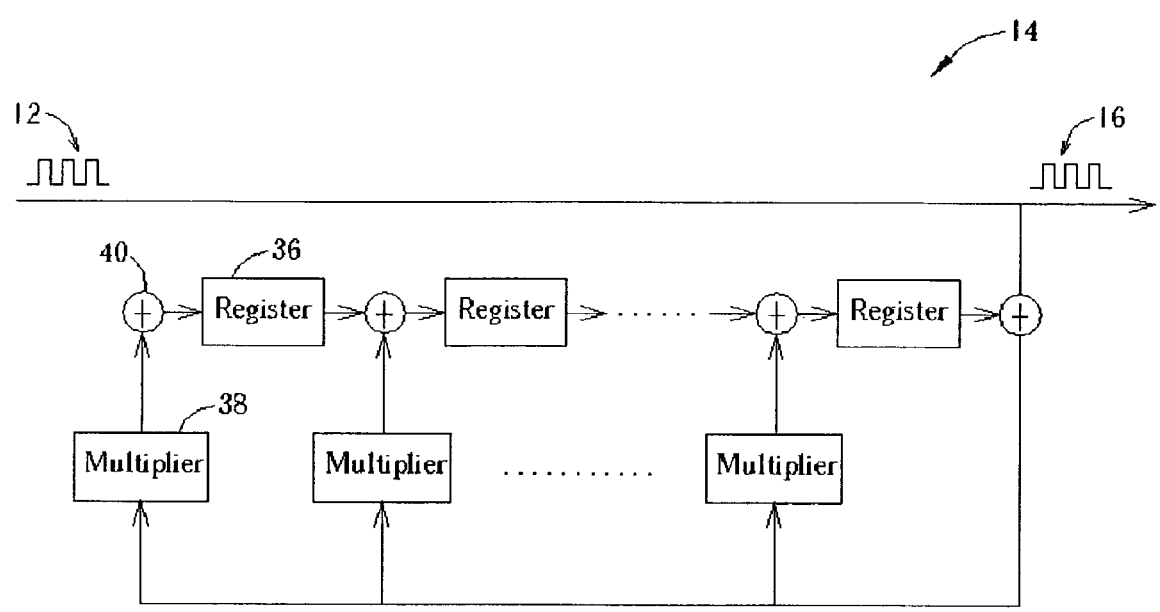
FIG. 2 is a circuit diagram of an encoder shown in FIG. 1.
Figure 6:
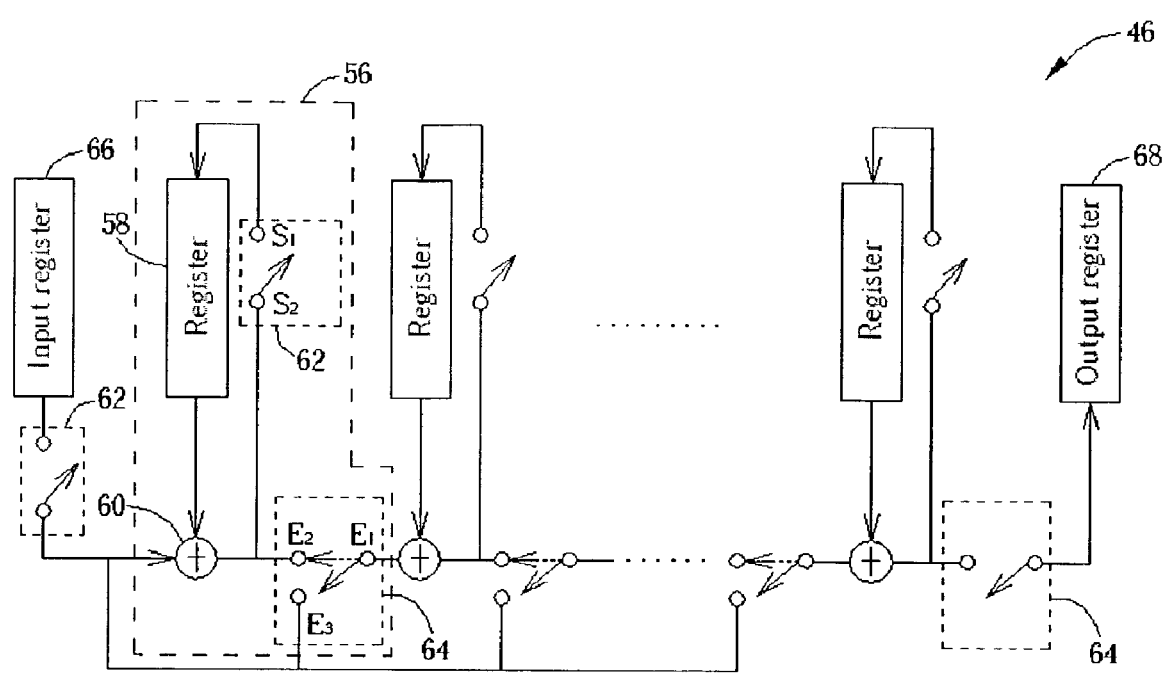
FIG. 6 is a circuit diagram of a processing module shown in FIG. 5.
Figure 7:
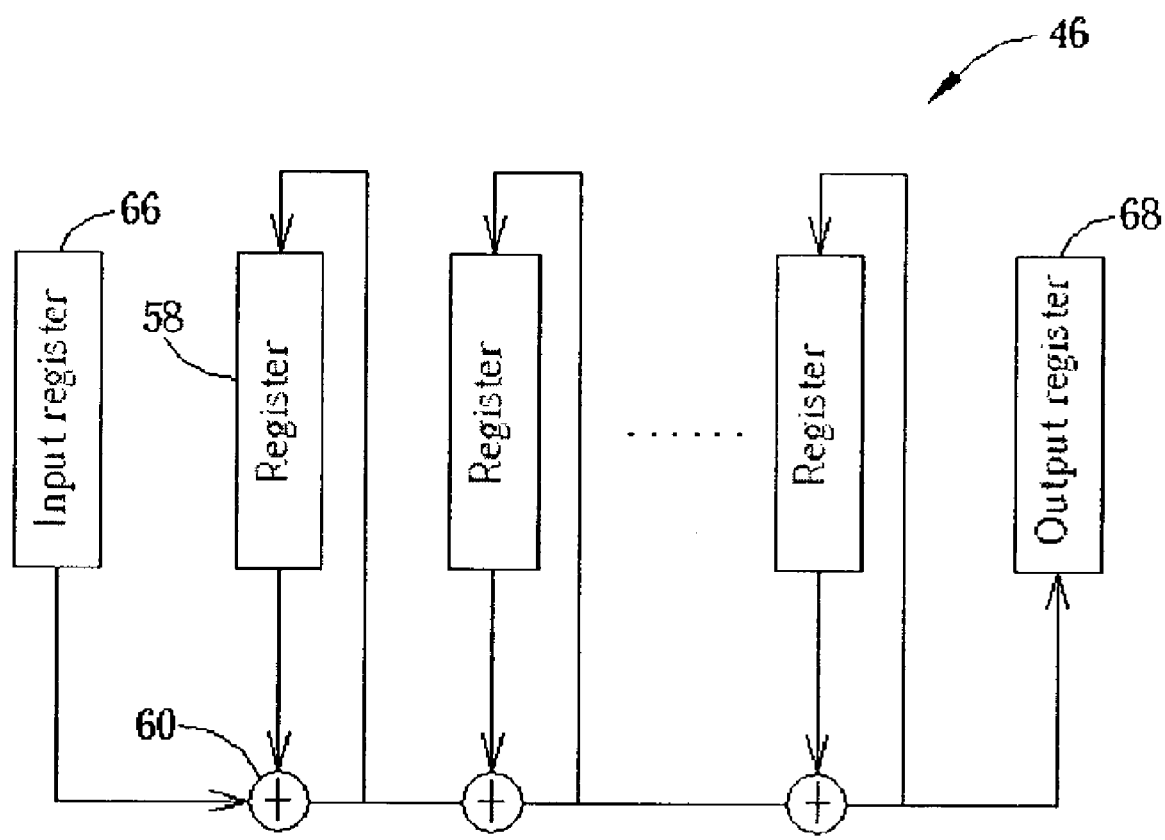
FIG. 7 is a first equivalent circuit of the processing module shown in FIG. 6.
Figure 8:
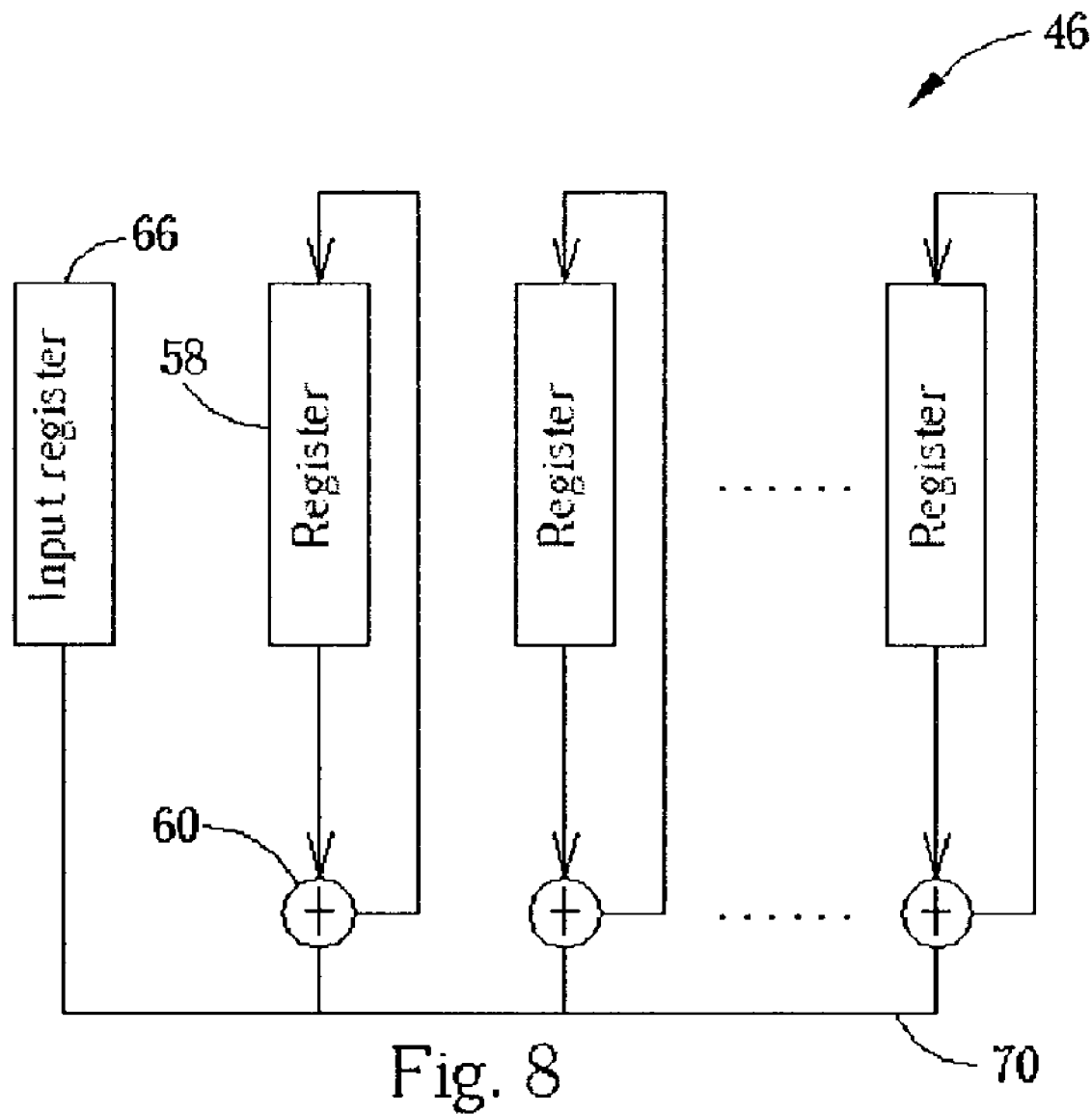
FIG. 8 is a second equivalent circuit of the processing module shown in FIG. 6.
Figure 9:
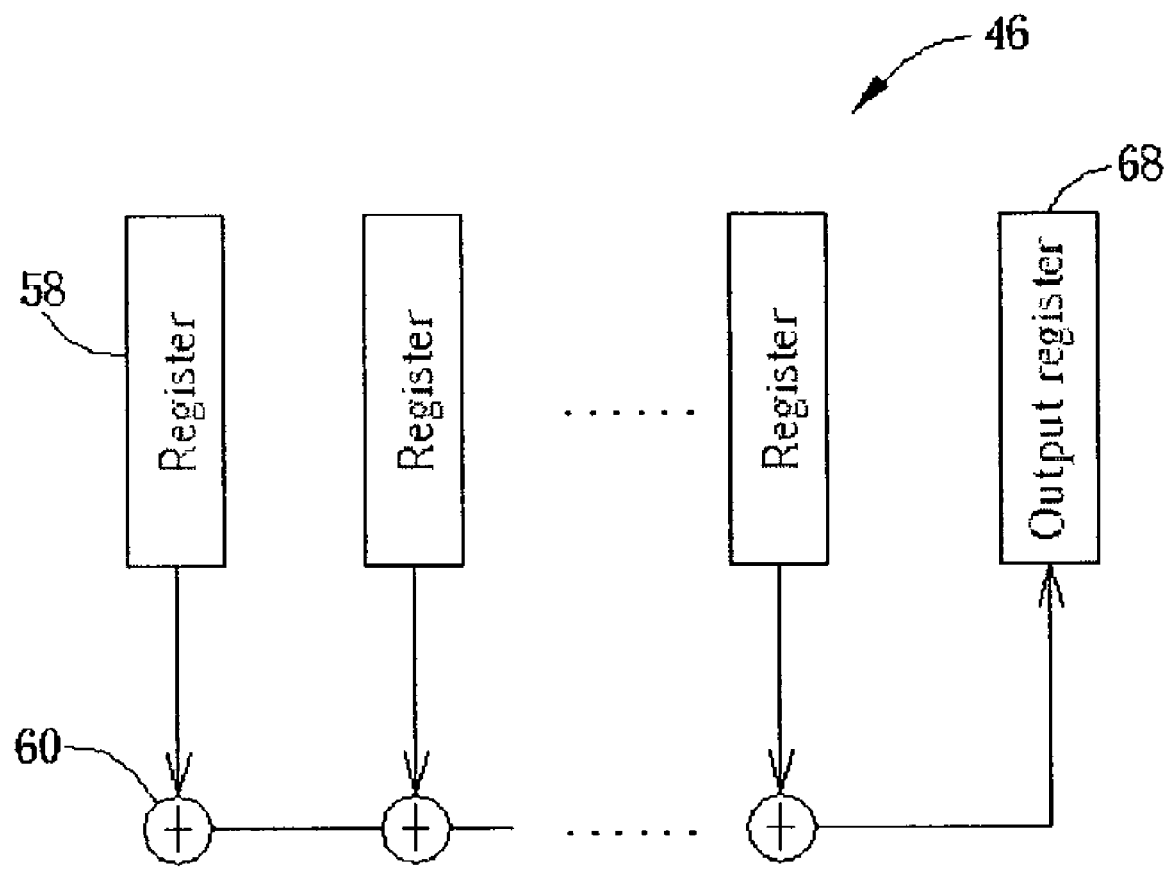
FIG. 9 is a third equivalent circuit of the processing module shown in FIG. 6.

Please refer to FIG. 6, FIG. 7, FIG. 8, and FIG. 9. FIG. 6 is a circuit diagram of the processing module 46 shown in FIG. 5. FIG. 7 is a first equivalent circuit of the processing module 46 shown in FIG. 6. FIG. 8 is a second equivalent circuit of the processing module 46 shown in FIG. 6. FIG. 9 is a third equivalent circuit of the processing module 46 shown in FIG. 6. The processing module 46 includes a plurality of processing units 56. Each processing unit 56 has a register 58, an adder 60 performing an XOR logic operation, a first switch 62, and a second switch 64. In addition, the processing module 46 has an input register 66 for storing an input data, and an output register 68 for storing an output data corresponding to the input data. The input register 66 is connected to the processing unit 56 via the first switch 62, and the output register 68 is connected to the processing unit 56 via the second switch 64. In the preferred embodiment, the controller 48 is capable of determining the number of processing units 56 that are enabled according to the number of symbols related to the calculation of the Reed-Solomon code. That is, the processing module 46 is programmed by the controller 48 for generating the required Reed-Solomon code. In addition, the controller 48 can control the first switch 62 and the second switch 64 of each processing unit 56 to acquire different equivalent circuits with different functions. For example, when the first switch 62 connects nodes S1, S2, and the second switch 62 connects nodes E1, E2, the equivalent circuit is shown in FIG. 7. Please refer to FIG. 7 in conjunction with FIG. 2. The circuit combination of the processing module 46 and the Galois field multiplier 44 is similar to the encoder 14 that has a circuit structure formed by the registers 36, multipliers 38, and adders 40. The only difference is that the encoder 14 shown in FIG. 2 performs the Galois Field addition on the temporary result stored in the last register 36 of the encoder 14 to generate the final code word 16. With regard to the processing module 46 in the preferred embodiment, there is no adder 60 connecting the input register 66 storing the input data and the output register 68 storing the temporary result. Therefore, the digital signal processor 40 uses adder software instead of adder hardware to perform the required Galois field addition for the first equivalent circuit shown in FIG. 7. That is, the input data and the temporary result are retrieved from the input register 66 and the output register 68 to be added with the help of the adder software. Compared with the encoder 14 shown in FIG. 2, the digital signal processor 40 uses the Galois field multiplier 44 to replace each multiplier 38 of the encoder 14 for performing the Galois field multiplication. Therefore, the controller 48 has to transmit processing data of each processing unit 56 to the Galois field multiplier 44 for the required Galois field multiplication. Then, the following adder 60 performs the Galois field addition on the processing data outputted from the Galois field multiplier 44. For example, the input data stored in the input register 66 is transmitted to the Galois field multiplier 44 for the required Galois field multiplication, and then the result is transmitted back to the processing module 46 for a following Galois field addition performed by the adjacent processing unit 56. The addition result is then stored in the register 58 of the processing unit 56. The identical operation is repeated. That is, the processing unit 58 performs the Galois field addition on the processing data stored in the register 58 of the previous processing unit 56 and the multiplication result returned from the Galois field multiplier 44. Finally, the temporary result stored in the output register 68 and the input data stored in the input register 66 are added according to the above-mentioned adder software, and the final result is the code word 16 shown in FIG. 1. In other words, the processing module 46 delivers processing data to the external Galois field multiplier 44 for the required multiplication operation, and the processing module 46 has no multiplier within. Therefore, each processing unit 56 does not include hardware of the prior art multiplier 38 so that the production cost is reduced.

Figure 3:
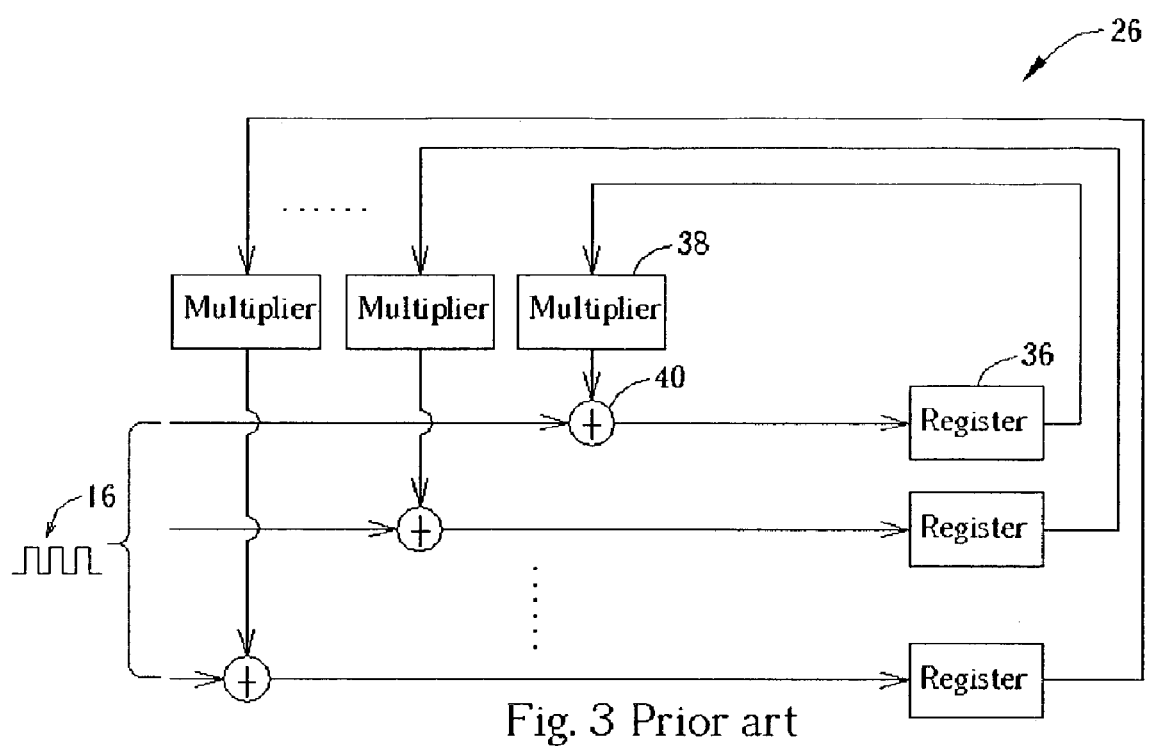
FIG. 3 is a circuit diagram of a syndrome generator shown in FIG. 1.

When the first switch 62 connects nodes S1, S2, and the second switch 64 connects nodes E1, E3, the equivalent circuit of the processing module 46 is shown in FIG. 8. Please refer to FIG. 8 in conjunction with FIG. 3. The input data stored in the input register 66 is simultaneously passed to the adder 60 of each processing unit 56. After the adder 60 performs the Galois field addition on the input data, the addition result is stored in the corresponding register 58. Then, the controller 48 transmits the addition results stored in the corresponding registers 58 to the Galois field multiplier 44. The Galois field multiplier 44 transmits the multiplication results back to the processing module 46 for a following addition operation. That is, a following input data is inputted to the input register 66, and the input data will be simultaneously passed to each adder 60. Each of the adders 60 performs the addition operation on the multiplication result corresponding to the previous input data and the current input data. The addition operation and the multiplication operation as mentioned above are repeated until each input data related to the code word 16 has been processed. In the end, the register 58 of each processing unit 56 stores a syndrome corresponding to the code word 16. If each syndrome is equal to 0, there is no error bit existing in the code word 16. To sum up, the combination of the processing module 46 shown in FIG. 8 and the Galois field multiplier 44 shown in FIG. 5 is equivalent to the syndrome generator 38 shown in FIG. 3. The Galois field multiplier 44, in the preferred embodiment, handles the multiplication operations performed by multipliers 38 shown in FIG. 3. Therefore, each processing unit 56 does not include hardware of the prior art multiplier 38 so that the production cost is reduced.

Figure 4:
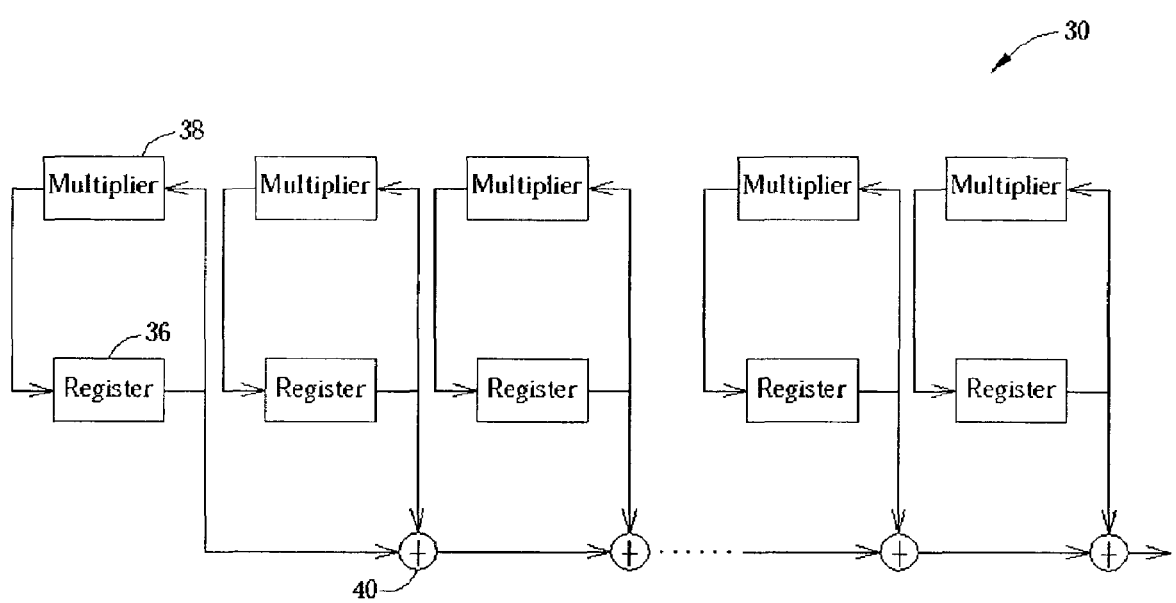
FIG. 4 is a circuit diagram of an error locating circuit shown in FIG. 1.

When the first switch 62 of the processing module 46 shown in FIG. 6 becomes an open circuit, and the second switch 64 of the processing module 46 shown in FIG. 6 connects nodes E1, E2, the equivalent circuit is shown in FIG. 9. Please refer to FIG. 9 in conjunction with FIG. 4. The error locating circuit 30 shown in FIG. 4 is used to perform successive addition operations such as a prior art Chien search operation. In the preferred embodiment, the Galois field multiplier 44 is used to handle Galois field multiplication operations for each processing unit 56. The register 58 of each processing unit 56 stores one of the coefficients related to the error location polynomial calculated by the polynomial generator 28 shown in FIG. 1. For example, the input data 12 includes 172 symbols, and each symbol has 8 bits. That is, the input data 12 corresponds to a Galois field $GF(2^8)$, which includes a plurality of elements $\alpha^0, \alpha^1, \ldots, \alpha^{255}$. It is noteworthy that $\alpha^0$ is equal to 0. When the encoder 14 shown in FIG. 1 uses a generator polynomial G(x) with a degree of 20 to generate the code word 16. The error correction code having 20 symbols is annexed to the input data 12. Therefore, the code word 16 has 182 symbols in total. The code word 16 is generally represented by RS(182,172), and the error correction code is capable of correcting 10 symbols having error bits. The error location polynomial P(x) is represented by the following equation.

$$P(x)=C_{10}*X^{10}+C_9*X^9+\ldots\ldots+C_2*X^2+C_1*X^1+1$$

Then, each element $\alpha^0, \alpha^1, \ldots, \alpha^{255}$ is applied to the polynomial P(x). If the P ($\alpha^n$) is not equal to 0, the $n^{th}$ symbol within the code word 16 is erroneous. In the beginning, the registers 58 respectively store the coefficients $C_{10}$~$C_1$. While the prior art Chien search is executed, the Galois field multiplier 44 sequentially performs the Galois field multiplication on each element $\alpha^1, \ldots, \alpha^{255}$ and the registers 58 storing coefficients $C_{10}$~$C_1$, and transmits the multiplication result back to the registers 58. That is, the registers 58 respectively store $C_{10}(\alpha^{10}), C_9(\alpha^9), \ldots\ldots, C_1(\alpha^1)$. Then, the adders 60 are used to perform successive addition operations on the data stored in the registers 58. The output register 68 will record $C_{10}.\alpha^{10}+C_9.\alpha^9+\ldots\ldots+C_1.\alpha^1$, that is, P($\alpha$)−1. If the 1$^{st}$ symbol is correct, the P($\alpha^1$) is equal to 0. In other words, the P($\alpha^1$)−1 is equal to 1 after the well-known XOR logic operation. In the following operation, the Galois field multiplier 44 sequentially performs the Galois field multiplication on each element $\alpha^1, \ldots, \alpha^{255}$ and the registers 58 storing coefficients $C_{10}.\alpha^{10}, C_9.\alpha^9, \ldots\ldots, C_1.\alpha^1$, and transmits the multiplication result back to the registers 58. The registers 58 now respectively record $(C_{10}.\alpha^{10}).\alpha^{10}, (C_9.\alpha^9).\alpha^9, \ldots\ldots, (C_1.\alpha^1).\alpha^1$, that is, $(C_{10}.\alpha^2)^{10}, (C_9.\alpha^2)^9, \ldots\ldots, (C_1.\alpha^2)^1$. Therefore, the output register 68 finally stores P($\alpha^2$)−1 to determine whether the 2$^{nd}$ symbol is erroneous or not. With repetitions of the above operation, each symbol is sequentially checked to find out which symbol within the received code word 16 has error bits. It is obvious that the output register 68 records P(x)−1. After the data stored in the output register 68 is compared with 1, the locations of error symbols within the code word 16 are determined. However, when the adders 60 perform successive addition operations on the data stored in the registers 58 to generate a result result P(x)−1, an additional addition operation is performed to the result, that is, the overall operation becomes P(x)−1 XOR 1. The output register 68 records P(x) now. Similarly, the result stored in the output register 68 is compared with 0 to determine whether the corresponding symbol is erroneous. The circuit structure according to the present invention, therefore, is capable of achieving the same goal of the prior art Chien search algorithm according to different conditions. The Galois field multiplier 44, in the preferred embodiment, handles the multiplication operations performed by multipliers 38 shown in FIG. 4. Therefore, each processing unit 56 does not include hardware of the prior art multiplier 38 so as to reduce the production cost.

With regard to the processing module 46, the input data stored in the input register 66 has to pass a plurality of processing units 56 to generate a corresponding output data, and the output data is finally recorded in the output register. If the error correction code of the input data is defined to include many symbols, the controller 48 needs to enable a corresponding amount of processing units 56. However, when the total amount of processing units 56 increases, the total number related to required calculations for generating the output data increases. Therefore, a critical path corresponding to the output data increases. The claimed processing circuit uses at least a buffer positioned between two processing units 56 for partitioning the original critical path into shorter critical paths. For example, if the claimed processing circuit has one buffer, the buffer can separate the processing units 56 into a first block and a second block. The first block is used to process an input data stored in the input register 66, and stores a first result in the buffer. The first result stored in the buffer is used as an input data of the second block for generating the output data corresponding to the input data of the first block. While the second block is active to process the first result generated from the first block, the input register 66 of the first block is capable of receiving a new input data and processing the new input data. In other words, the first and second blocks form a pipeline structure to handle different input data simultaneously. The critical path is shortened to be half of the original one. Not only is the processing efficiency of the processing module 46 improved, but also the shortened critical path reduces the probability of generating error result when the processing module 46 operates. In the preferred embodiment, the Galois field multiplier 44 is a hardware circuit for performing the Galois field multiplication. However, the Galois field multiplier 44 can be implemented by a software look-up table, which comprises multiplication results related to the Galois field multiplication. Therefore, the Galois field multiplication is performed through the software look-up table for obtaining the same function as the hardware circuit.

In contrast to the prior art, each processing unit of the claimed processing circuit has an adder and a register. When processing data requiring the Galois field multiplication, the processing data is transmitted from the processing unit to an external Galois field multiplier. The processing circuit, therefore, has low power consumption and a small size without any multipliers located inside each processing unit. In addition, each processing unit of the claimed processing circuit has a plurality switches. The claimed processing circuit can control the on/off statuses of the switches to form different circuits for different purposes. That is, the different circuits share the same circuit elements to achieve the objective of sharing hardware resource. To sum up, calculations related to the Reed-Solomon code can be fulfilled through a small amount of circuit elements so that the processing circuit needs small space to locate the circuit elements. In addition, the claimed circuit uses buffers to form a pipeline structure to handle different input data simultaneously. Not only is the processing efficiency improved, but also the critical path is shortened.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A processing circuit of a microprocessor for processing an input data to generate an output data, the microprocessor comprising a Galois field multiplier electrically connected to the processing circuit for, performing a Galois field multiplication upon a plurality of processing data being processed by the processing circuit, the processing circuit comprising:

a first register for storing the input data;

a plurality of processing units each being cascaded in series, a starting processing unit of the processing units electrically connected to the first register, each processing unit comprising an input port, an output port, a Galois field adder electrically connected between the input port and the output port, and a second register electrically connected to the Galois field adder; and a controller for controlling operation of the processing circuit;

wherein the controller controls each processing unit to transmit processing data requiring Galois field multiplication to the Galois field multiplier, and the processing data outputted from the Galois field multiplier are transmitted back to each corresponding processing unit.

2. The processing circuit of claim 1 wherein the Galois field adder performs an exclusive OR (XOR) logic operation.

3. The processing circuit of claim 1 wherein the Galois field multiplier is implemented by a hardware circuit or a software look-up table.

4. The processing circuit of claim 1 wherein the microprocessor is a digital signal processor (DSP).

5. The processing circuit of claim 1 further comprising a third register electrically connected to a terminal processing unit of the processing units for storing the output data.

6. The processing circuit of claim 1 wherein the microprocessor is used for processing a Reed-Solomon error correction code that has a plurality of symbols.

7. The processing circuit of claim 6 wherein the controller decides a total number of the processing units that are enabled according to a total number of the symbols of the Reed-Solomon error correction code.

8. The processing circuit of claim 1 wherein the processing unit further comprises:

a first switch positioned between the second register and the Galois field adder for controlling whether the Galois field adder is connected to the second register or not; and a second switch for controlling whether the Galois field adder is electrically connected to the Galois field adder of an adjacent processing unit or the Galois field adder is electrically connected to a data transmission line.

9. The processing circuit of claim 8 wherein the processing circuit is used for generating a Reed-Solomon error correction code corresponding to the input data when the first switch makes the Galois field adder electrically connected to the second register and the second switch makes the Galois field adders of two adjacent processing units electrically connected.

10. The processing circuit of claim 9 further comprising a buffer electrically connected between two adjacent processing units, the output data of a leading processing unit of the two adjacent processing units being the input data of a following processing unit of the two adjacent processing units, wherein after the leading processing unit finishes processing a first input data and stores a corresponding first output data in the buffer, the leading processing unit is capable of handling a second input data to generate a corresponding second output data.

11. The processing circuit of claim 9 wherein the processing circuit is used for generating a syndrome code corresponding to the output data comprising the Reed-Solomon error correction code when the first switch makes the Galois field adder electrically disconnected from the second register and the second switch makes the Galois field adder electrically connected to the data transmission line.

12. The processing circuit of claim 11 wherein the processing circuit is used for determining an error location of the output data according to the syndrome code when the first switch makes the Galois field adder electrically disconnected from the second register and the second switch makes the Galois field adders of two adjacent processing units electrically connected.

13. A data processing method of a microprocessor, the microprocessor comprising:

a processing circuit for processing an input data to generate an output data, the processing circuit comprising:

a first register for storing the input data;

a plurality of processing units each being cascaded, a beginning processing unit of the processing units electrically connected to the first register, each processing unit comprising an input port, an output port, a Galois field adder electrically connected between the input port and the output port, and a second register electrically connected to the Galois field adder; and a controller for controlling operation of the processing circuit; and a Galois field multiplier electrically connected to the processing circuit for performing Galois field multiplication upon a plurality of processing data handled by the processing circuit;

the data processing method comprising:

controlling each processing unit to transmit processing data required the Galois field multiplication to the Galois field multiplier, and transmitting the processing data outputted from the Galois field multiplier back to each corresponding processing unit.

14. The data processing method of claim 13 wherein the Galois field adder performs an exclusive OR (XOR) logic operation.

15. The data processing method of claim 15 wherein the microprocessor is used for processing a Reed-Solomon error correction code that has a plurality of symbols.

16. The data processing method of claim 15 wherein the controller decides a total number of the processing units that are enabled according to a total number of the symbols of the Reed-Solomon error correction code.

17. The data processing method of claim 13 wherein the processing circuit further comprises a third register electrically connected to a terminal processing unit of the processing units for storing the output data.

* * * * *